United States Patent
Six

(10) Patent No.: US 7,311,242 B2
(45) Date of Patent: Dec. 25, 2007

(54) DESIGN OF AN INSULATED CAVITY

(75) Inventor: Jean-Claude Six, Saint Contest (FR)

(73) Assignee: NXP, B.V., Eindhoven (NL)

( * ) Notice: Subject to any disclaimer, the term of this patent is extended or adjusted under 35 U.S.C. 154(b) by 0 days.

(21) Appl. No.: 10/507,332

(22) PCT Filed: Mar. 11, 2003

(86) PCT No.: PCT/IB03/00938

§ 371 (c)(1),
(2), (4) Date: Sep. 10, 2004

(87) PCT Pub. No.: WO03/079439

PCT Pub. Date: Sep. 25, 2003

(65) Prior Publication Data

US 2005/0098612 A1    May 12, 2005

(30) Foreign Application Priority Data

Mar. 19, 2002  (FR) .................................. 02/03370

(51) Int. Cl.
*B23K 31/02* (2006.01)
(52) U.S. Cl. ................... 228/180.22; 228/254
(58) Field of Classification Search .. 228/123.1–124.6, 228/174, 135–180.22; 257/737, 738; 438/613–617
See application file for complete search history.

(56) References Cited

U.S. PATENT DOCUMENTS

| 4,604,644 | A | * | 8/1986 | Beckham et al. ............ 257/737 |
| 6,062,461 | A | | 5/2000 | Sparks et al. ............ 228/123.1 |
| 6,097,097 | A | | 8/2000 | Hirose |
| 7,019,407 | B2 | * | 3/2006 | Chen et al. .................. 257/778 |
| 7,057,284 | B2 | * | 6/2006 | Chauhan et al. ............ 257/737 |
| 7,141,869 | B2 | * | 11/2006 | Kim et al. .................. 257/673 |
| 7,221,767 | B2 | * | 5/2007 | Mullenborn et al. ........ 381/174 |
| 2003/0128854 | A1 | * | 7/2003 | Mullenborn et al. ........ 381/174 |
| 2003/0214049 | A1 | * | 11/2003 | Hortaleza et al. ........... 257/778 |
| 2006/0240595 | A1 | * | 10/2006 | Lee et al. .................... 438/108 |

FOREIGN PATENT DOCUMENTS

EP       0 951 068 A    10/1999
JP       59 088864 A    5/1984

* cited by examiner

*Primary Examiner*—Kiley Stoner
(74) *Attorney, Agent, or Firm*—Peter Zawilski

(57) ABSTRACT

The invention relates to a method for connecting a connecting surface of a first silicon wafer [WA1] with a connecting surface of a second silicon wafer [WA2] so as to form an insulated cavity after assembly, at least one of the two silicon wafers [WA] including at least one functional area [DA] intended to be within the cavity. The method according to the invention includes a step [PLTS] of depositing alloy soldering bumps [PLTC] on the connecting surface of the first silicon wafer [WA1], said bumps [PLTC] being separated from one another by an even distance which is sufficiently small to cause joinings during the assembly of the two silicon wafers. Said step [PLTS] of depositing the soldering bumps [PLTE] is carried out during the step of depositing the soldering bumps [PLTE] intended for the electrical contacts. The method includes a reflux soldering step [RFX] for assembling the two silicon wafers by melting of the alloy soldering bumps. Application: Protection of semiconductor elements sensitive to the external conditions.

5 Claims, 3 Drawing Sheets

DESIGN OF AN INSULATED CAVITY

Figure 1:
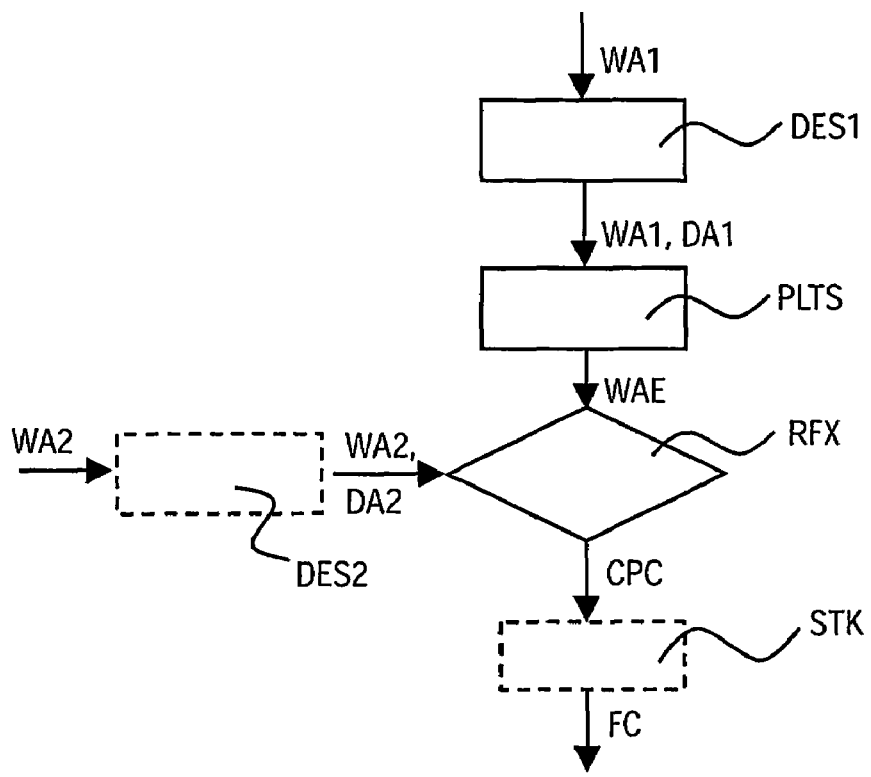

The invention relates to a method for connecting a connecting surface of a first silicon wafer with a connecting surface of a second silicon wafer so as to form an insulated cavity after assembly, at least one of the two silicon wafers including at least one functional area intended to be within the cavity.

Such a method is known from the patent published under the number U.S. Pat. No. 6,062,461 describing a method for connecting etched silicon wafers by soldering. This method makes it possible to form an insulated cavity by assembling two silicon wafers on which there are deposited either a continuous line of soldering material on each silicon wafer or a continuous line on one of the silicon wafers and an extended metallic layer on the other silicon wafer, and the method then consists of heating so that, the soldering material melting, the connection between the two silicon wafers is achieved.

The invention relates to the following considerations. In the state of the art, it is necessary first of all to deposit a layer on at least one silicon wafer. In addition a step of producing the continuous line or lines on one of the two silicon wafers requires an additional manufacturing step by material deposit, evaporation, printing by mask or ion bombardment. This sometimes gives rise to the development of additional tools: masks for making an impression etc. This is recognized as resulting in additional cost.

One aim of the invention is to make it possible to manufacture an insulated cavity by means of a fast and simple method, that is to say one which does not require any additional step or additional tools.

In fact a method according to the introductory paragraph is characterized according to the invention in that it includes the steps of:

depositing bumps of soldering alloy on the connecting surface of the first silicon wafer, said bumps being separated from each other by an even distance which is sufficiently small to cause joins during the assembly of the two silicon wafers, said deposition of the soldering bumps being carried out during the step of depositing the soldering bumps intended for the electrical contacts, reflux soldering in order to assemble the two silicon wafers by melting the alloy soldering bumps.

Such a method advantageously resolves the problem disclosed above by profiting from an obligatory step, the deposition of soldering bumps intended for the electrical contacts, for the manufacture of the insulated cavity.

In one embodiment of the invention, in the case where the soldering bumps are not joined to each other by the reflux heating, a step of applying resin (polymer-based glue for example) on the contour of the cavity is carried out so as to close the cavity. This embodiment resolves a problem sometimes encountered when the soldering bumps are not joined to each other and the creation of an insulated cavity is necessary, however.

In a particular embodiment, the two silicon wafers include functional etchings. This embodiment has the advantage of making it possible to combine several functionalities sensitive to the external environment on the same circuit and within the same cavity, thus limiting the number of circuit manufacturing steps and the complexity of the circuit obtained. The purpose of such an embodiment is to make it possible to combine, in little space and with few steps, at least two functions on the same circuit.

In an advantageous embodiment, the method includes a step of filling the cavity with an inert gas. The purpose of this embodiment is to give good insulation of the components present on the silicon wafers inside the cavity, to allow that said components are well isolated from contamination and variations in the external environment. Thus the method can advantageously be implemented in an enclosure filled with an inert atmosphere.

The invention can therefore be implemented in order to produce any integrated circuit where an insulated cavity is advantageous. In one of its applications, the invention therefore also relates to an integrated circuit obtained according to the invention. More broadly the invention relates to any application where it is wished to attach an integrated circuit to another one or to a substrate without connection by wire (by "flip chip"). This is particularly advantageous in applications with discrete components (for example surface wave filters, BAWs (Bulk Acoustic Wave filters), SAWs (Surface Acoustic Wave filters), MEM (Micro Electro-Mechanical) switches etc) in relatively high-frequency applications where the connections give rise to parasitic phenomena. These components can advantageously be etched, one on one silicon wafer, the other on the second silicon wafer and therefore combined, according to the invention, within the same insulated cavity.

Such applications concern in particular telecommunications, TV tuners, circuits intended for wireless, high-rate transmissions etc.

The integrated circuit obtained by the method according to the invention is then advantageously assembled (by bonding or flipping) on a metallic grille and molded in a plastic box. The last step is conventional in the assembly of semiconductor circuits.

More generally, an integrated circuit according to the invention can advantageously be implemented in an apparatus intended for telecommunication, including more particularly wireless communication, high-rate transmission etc. The invention therefore relates to a communication apparatus comprising an antenna, a switch advantageously produced by means of an MEM switch, reception and transmission filters, reception and transmission amplifiers as well as a unit for processing the signal received. The filters are here advantageously surface wave filters, for example BAW or SAW filters. The MEMs comprise an electrode which is in suspension in air, this electrode often consisting of a bimetallic strip. This strip must be placed in an insulating cavity since this electrode is sensitive. A cavity according to the invention can advantageously find an application here. In addition, BAW and SAW filters require the presence of a cavity for the resonator to function. The double utility of the invention, which makes it possible to combine the filters with the MEM switch in the same cavity, within the same circuit assembled by the technique of attaching a silicon wafer to another with wireless connection, will be understood here.

The invention will be further described with reference to examples of embodiments shown in the drawings to which, however, the invention is not restricted.

Figure 2:
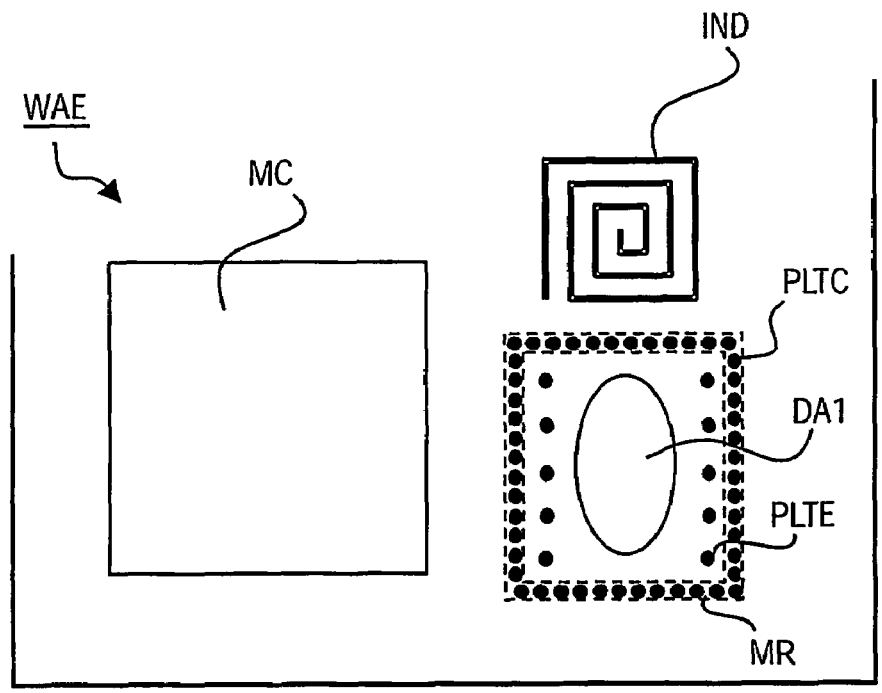
Figure 3:
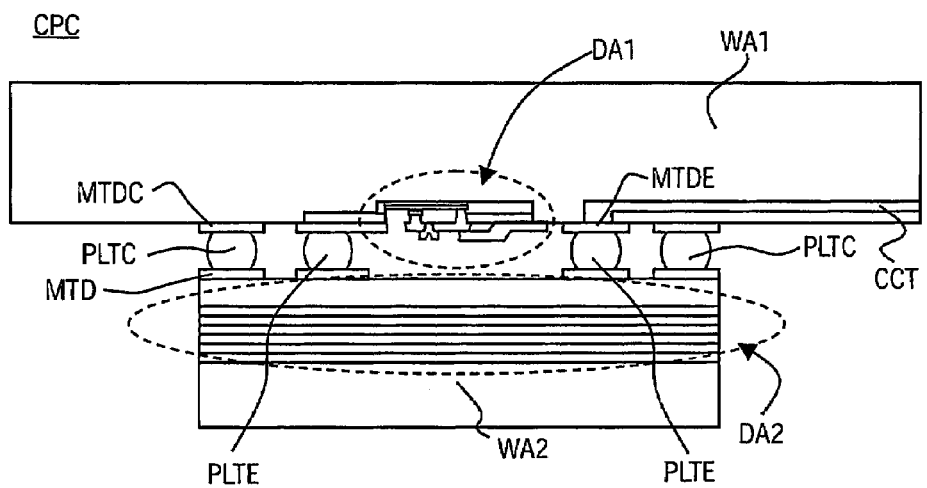
Figure 4:
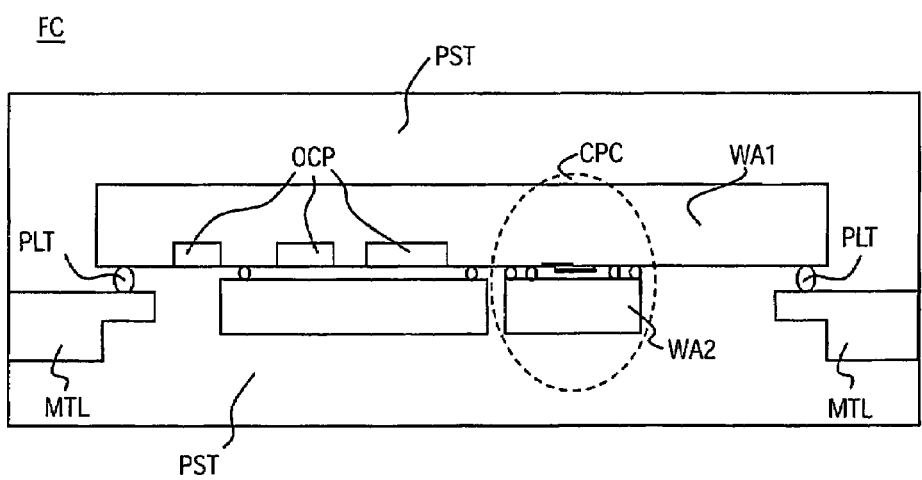
Figure 5:
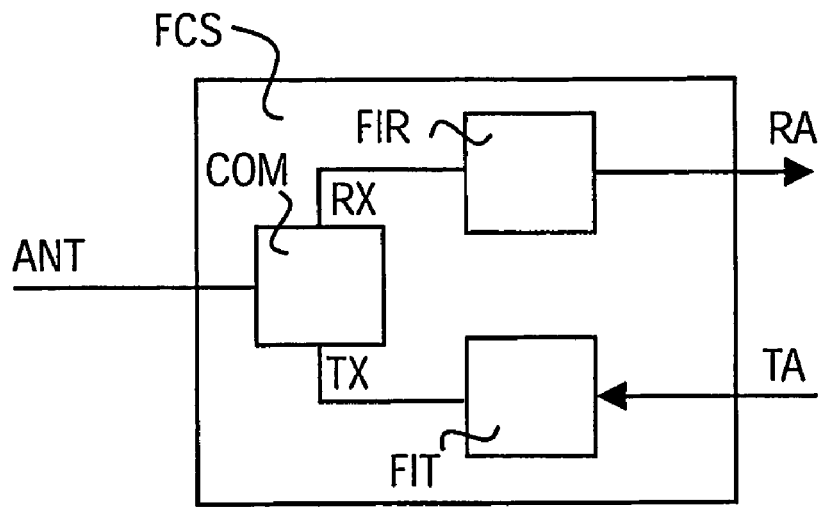
Figure 6:
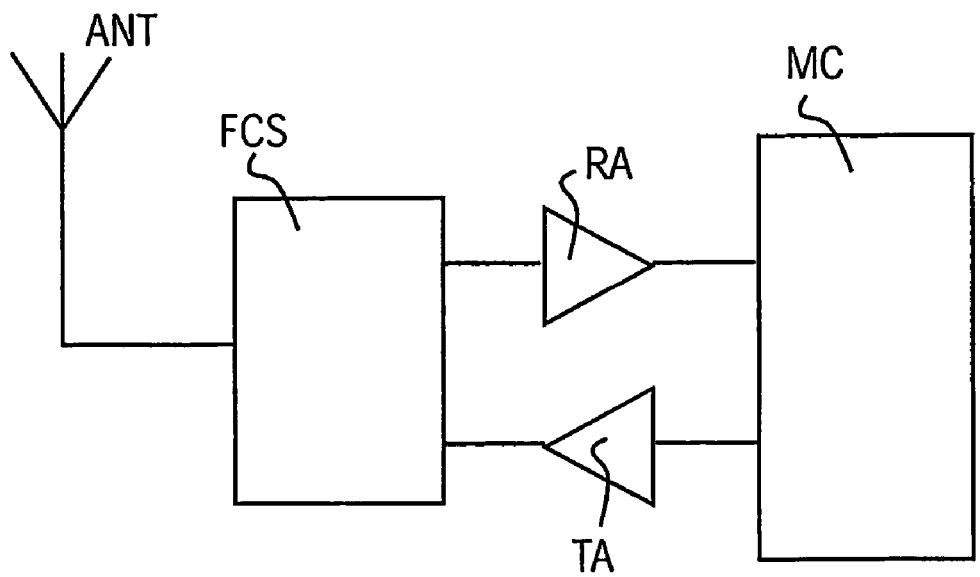

FIG. 1 depicts a schematic diagram of the method according to the invention,

FIG. 2 is a plan view of a silicon wafer obtained at an intermediate step of the method according to the invention, FIG. 3 depicts an integrated circuit obtained according to the invention, FIG. 4 depicts an integrated circuit obtained according to the preferred embodiment of the invention, FIG. 5 depicts a block diagram of a circuit according to the preferred embodiment of the invention, FIG. 6 is a functional diagram of a telecommunication apparatus advantageously using a circuit according to the invention.

The following remarks concern the reference signs. Similar entities are designated by a reference by means of identical letters in all the Figures. Several similar entities may appear in a single Figure. In this case, a digit or a suffix is added to the reference by letters in order to distinguish similar entities. The digit or suffix may be omitted for reasons of convenience. This applies to the description and to the claims.

The following description is presented to enable a person skilled in the art to produce and make use of the invention. This description is provided in the context of the patent application and its requirements. Various alternatives to the preferred embodiment will be obvious to a person skilled in the art and the generic principles of the invention disclosed here can be applied to other implementations. Thus the present invention is not deemed to be limited to the embodiment described but rather to have the widest scope in accordance with the principles and characteristics described below.

FIG. 1 shows a schematic diagram of the method according to the invention. A first silicon wafer WA1 is subjected to an etching step DES1. Etching here means the implementation of all or some of the known methods of manufacturing functional semiconductors. At the end of this step, the first silicon wafer comprises at least one functional area DA1 which must be protected within an insulated cavity, for example an MEM switch or a surface wave filter. Advantageously, the functional area DA1 is surrounded by a metallic ring produced during previous steps by means of conventional methods (deposition of a metallic layer, filling trenches made in the substrate with metal etc). This optional metallic ring then determines more precisely the surface for connection of the silicon wafer with the second. Typically the functional area also comprises metallic areas for producing electrical contacts. Next, a step of depositing bumps PLTS intended to produce the electrical contacts is performed. These bumps are deposited on the previously mentioned metallic areas. This step is carried out conventionally for the manufacture of circuits produced by turning an integrated circuit over on another without connection by wire. The electrical contacts are then made when the second silicon wafer is turned over on the previous one at the electrical contact bumps situated at the required places. During the step of depositing bumps PLTS, additional bumps not intended for the electrical contacts are then deposited according to the invention on the connection surface surrounding the functional area DA1. If the connecting surface is a metallic ring then the bumps are deposited on this metallic ring. A silicon wafer WAE ready to be assembled in a reflux soldering step RFX on a second silicon wafer WA2 is then obtained.

FIG. 2 is a plan view of a silicon wafer WAE obtained after this step PLTS of depositing the bumps. It therefore comprises in particular a functional area DA1 and can also comprise various other circuit areas: for example an inductor IND, another functional circuit portion MC etc. The bumps consist of material able to melt at the conventional reflux soldering temperatures used for flip-chip techniques. Thus conventionally the materials used are bumps formed by a tin-lead alloy ("solder bumps") or a gold alloy ("gold bumps"). The bumps deposited in the step PLTS are either electrical contact bumps PLTE or additional bumps PLTC intended to contribute to the formation of an insulated cavity for surrounding the functional area DA1. For example, the size of the tin-lead alloy bumps is generally, with current technologies, around 120 microns in diameter. The bumps PLTC intended to form the cavity will then advantageously be placed at a distance of approximately 60 microns from each other. These indicative dimensions make it possible to obtain a cavity with a size compatible with the elements conventionally implemented on the functional area or areas within a cavity. On the other hand, the bumps PLTS intended for the electrical contacts are conventionally spaced further apart so as to prevent their touching after the reflux soldering step. The dimensions given here are only indicative in the light of current technologies. This does not exclude technology one day making it possible to produce smaller bumps and nevertheless to produce an insulated cavity according to the principle of the invention. Overall, the ratio between the size of the bumps and the space between the bumps can be between $1/10$ and 1 according to the size of the bumps and the spreading capability of the material of which they consist. Advantageously, it has been seen that the functional area was, optionally, surrounded by a metallic ring MR shown in dotted lines in the Figure. In this case, the bumps PLTC are then deposited on this metallic ring. This makes it possible to ensure better adhesion and reliability of the interface.

Next, referring again to FIG. 1, a reflux soldering step RFX is carried out. The purpose of the reflux soldering is to produce the contact with the second silicon wafer WA2. Prior to the soldering step RFX proper, the second silicon wafer WA2 is placed in contact with the soldering bumps. During the soldering step RFX, the assembly is heated to a temperature which makes the alloy melt. For example, with the materials mentioned above, the temperature will be approximately 100° C. It is advantageously below 110° C. in order not to damage the etched functional surfaces. The electrical and adhesion contacts are thus provided between the two silicon wafers WA1 and WA2. The seal is provided by the melting of the bumps, which join together to form a wall which, when the bumps are in accordance with the dimensions mentioned previously, will have a width of approximately 120 microns and a height of approximately 60 microns. The second silicon wafer WA2 may or not may not have been etched in an optional etching step DES2 and consequently include or not functional areas DA2. Optionally, it advantageously has a ring around the area which will be within the insulated cavity in order to provide good adhesion and reliability of the interface in parallel of the first silicon wafer which advantageously also has a metallic ring around the functional area to be placed within the cavity. This ring can be produced with etching or without etching, by simple deposition.

It should also be noted that here there is described a method in which a first silicon wafer WA1 comprises a functional area DA1, the deposition of the contact bumps being effected on this wafer WA1, but that the method according to the invention can also be implemented using a wafer on which there is no etching but on which there is only carried out the deposition of the soldering bumps, the etched area being included on the second silicon wafer. Although less advantageous, this embodiment can be envisaged according to the invention. FIG. 2 is therefore only indicative of an intermediate result of a special embodiment.

According to one advantageous embodiment, the reflux soldering step RFX is carried out with filling of the cavity with an inert gas. This filling can advantageously be carried out during the reflux soldering, which is then carried out in air or in an inert atmosphere. In this case the soldering, by connecting the bumps together, traps the air or inert gas.

After the reflux soldering step RFX, alternatively a resin, for example a glue, a polymer-based resin etc can be used for partial filling at the periphery of the cavity between the two silicon wafers. The propagation of the resin is limited by the network of bumps. In addition, the resin makes it possible to ensure the impermeability of the cavity where the bumps are not well connected to one another. The fact of adding this filling step with resin does not significantly change the size of the wall obtained around the cavity. This step can be carried out routinely in a method of connecting two silicon wafers or be carried out solely if unjoined bumps are detected.

FIG. 3 depicts an integrated circuit CPC obtained according to the invention. This Figure is merely indicative of a particular embodiment in which the two silicon wafers WA1 and WA2 are etched. More precisely, on the first silicon wafer WA1 there is etched a switch MEM in an active area DA1. On the second silicon wafer WA2 there is etched a resonator filter BAW in an active area DA2. The functioning of these areas and their insertion in a functional circuit are guaranteed by the presence of electrical contacts between areas are provided by virtue of the bumps of soldering material PLTE. These bumps are deposited during a bump deposition step conventionally used in the methods of generating circuits by turning over a silicon wafer on another without connection by wire. Under each of the bumps PLTE intended for the electrical contacts deposited, a metallic area MTDE is present. Advantageously, in contact with these areas MTDE and as required, contacts CCT are provided with components external to the active areas DA1 and DA2. For example, these contacts are hollowed out in the silicon wafer WA1 during the etching step DES prior to the assembly of the two silicon wafers. Advantageously, a metallic material is also deposited under the bumps PLTC intended to form the cavity. This metallic area takes the form of a metallic ring MTDC surrounding the active areas DA1 and DA2.

In a preferred embodiment, referring to FIG. 1, a final assembly step STK is carried out. This step consists preferentially of assembling by soldering the circuit CPC consisting of at least the two silicon wafers on a metallic grille MTL and then molding on the assembly in a plastic can PST. The soldering is for example carried out using bumps PLT which may have been deposited on the silicon wafer WA1 during the bump deposition step PLTS previously described. It can be seen, in FIG. 4, that the final circuit FC, obtained in the preferred embodiment of the invention, contains not only the circuit CPC but also other circuit portions OPC which may or may not contain insulating cavities. Thus a complete functional circuit is contained on the final circuit FC. An example of a complete functional circuit will now be described.

FIG. 5 depicts a block diagram of a circuit FC according to the preferred embodiment of the invention. According to the preferred embodiment of the invention, the circuit consisting of two silicon wafers comprises at least one cavity in which there are placed an MEM switch and a BAW or SAW filter. Such an implementation is moreover presented as an example in FIG. 3, where DA1 represents more particularly an MEM switch with a bimetallic strip and DA2 represents more particularly a BAW filter. These elements can for example advantageously be used within a circuit FCS as shown schematically in FIG. 5. This circuit consists of a reception chain for the received signals RX and a transmission chain for the transmitted signals TX with a switch COM connected to a reception/transmission line, for example an antenna ANT. The reception and transmission chains each include at least one filter, respectively FIR and FIT, which are each connected to amplifiers, respectively RA and TA. The filters FIR and FIT and the switch COM are advantageously BAW or SAW filters and an MEM switch used in a cavity according to the invention. Such a circuit FCS is advantageously used in a telecommunication apparatus intended for receiving and transmitting signals as shown in FIG. 6. This telecommunication apparatus advantageously uses a circuit FCS according to the preferred embodiment of the invention. It also comprises at least one antenna ANT, amplifiers RA and TA which can advantageously be integrated on the first or second silicon wafer of the circuit according to the invention, and finally signal processing means MC which can also advantageously be integrated on one of the two silicon wafers used for producing the circuit according to the invention, or even on both.

Although this invention has been described in accordance with the embodiments presented, a person skilled in the art will immediately recognize that there exist variants to the embodiments presented and that these variants remain within the spirit and scope of the present invention. Thus many modifications can be made by a person skilled in the art without for all that being excluded from the spirit and scope defined by the following claims.

The invention claimed is:

1. A method for connecting a connecting surface of a first silicon wafer with a connecting surface of a second silicon wafer so as to form an insulated cavity after assembly, at least one of the two silicon wafers including at least one functional area intended to be within the cavity, said method being characterized in that it includes the steps of:

depositing a first group of alloy soldering bumps on the connecting surface of the first silicon wafer, said first group of alloy soldering bumps being separated from one another by an even distance which is sufficiently small to cause joinings during the assembly of the two silicon wafers, the said deposition of the soldering bumps being carried out during the step of depositing the soldering bumps intended for the electrical contacts, depositing a second group of alloy soldering bumps on the connecting surface of the first silicon wafer, said second group of alloy soldering bumps being separated from one another by a distance which is sufficiently large to prevent joinings during the assembly of the two silicon wafers, and reflux soldering in order to connect the two silicon wafers by melting of the alloy soldering bumps.

2. A method as claimed in claim 1, also including a step of applying a resin to the contour of the cavity.

3. A method as claimed in claim 1, for which the two silicon wafers include functional etchings.

4. A method as claimed in claim 1, characterized in that it includes a step of filling the cavity with an inert gas.

5. A method as claimed in claim 1, characterized in that it is implemented within an enclosure filled with an inert atmosphere.

* * * * *